US012580104B2

(12) United States Patent (10) Patent No.: US 12,580,104 B2
Hirasawa et al. (45) Date of Patent: Mar. 17, 2026

(54) SHUNT RESISTOR AND SHUNT RESISTANCE DEVICE

(71) Applicant: KOA CORPORATION, Ina (JP)

(72) Inventors: Koichi Hirasawa, Ina (JP); Susumu Toyoda, Ina (JP); Keishi Nakamura, Ina (JP)

(73) Assignee: KOA CORPORATION, Ina (JP)

( * ) Notice: Subject to any disclaimer, the term of this patent is extended or adjusted under 35 U.S.C. 154(b) by 411 days.

(21) Appl. No.: 18/031,652

(22) PCT Filed: Jul. 14, 2021

(86) PCT No.: PCT/JP2021/026411
§ 371 (c)(1),
(2) Date: Apr. 13, 2023

(87) PCT Pub. No.: WO2022/085255
PCT Pub. Date: Apr. 28, 2022

(65) Prior Publication Data
US 2023/0386708 A1     Nov. 30, 2023

(30) Foreign Application Priority Data

Oct. 19, 2020    (JP) ................................. 2020-175107

(51) Int. Cl.
*H01C 1/144*        (2006.01)
*G01R 15/14*        (2006.01)
*H01C 7/00*         (2006.01)
(52) U.S. Cl.
CPC ........... *H01C 1/144* (2013.01); *G01R 15/146* (2013.01); *H01C 7/006* (2013.01)

(58) Field of Classification Search
CPC ....... H01C 1/144; H01C 7/006; G01R 15/146
See application file for complete search history.

(56) References Cited

U.S. PATENT DOCUMENTS

| | | | | | |
|---|---|---|---|---|---|
| 5,999,085 | A | * | 12/1999 | Szwarc | H01C 7/13 |
| | | | | | 338/309 |
| 7,911,319 | B2 | * | 3/2011 | Smith | G01R 1/203 |
| | | | | | 29/610.1 |
| 8,031,043 | B2 | * | 10/2011 | Schultz | H01C 1/014 |
| | | | | | 338/49 |
| 10,163,553 | B2 | * | 12/2018 | Kameko | H01C 17/28 |
| 10,614,933 | B2 | * | 4/2020 | Endo | G01R 1/203 |

(Continued)

FOREIGN PATENT DOCUMENTS

| | | |
|---|---|---|
| CN | 102696079 A | 9/2012 |
| CN | 106463220 A | 2/2017 |

(Continued)

OTHER PUBLICATIONS

Office Action dated Dec. 27, 2024, issued in counterpart CN application No. 202180070840.3. (6 pages).

(Continued)

*Primary Examiner* — Kyung S Lee
(74) *Attorney, Agent, or Firm* — WHDA, LLP

(57) ABSTRACT

The present invention relates a shunt resistor and a shunt resistance device. The shunt resistor (1) includes an electrode member (10). The electrode member (10) includes a contact portion (10*a*) contacting a resistance element (5), and a slit (20) formed on the contact portion (10*a*).

7 Claims, 10 Drawing Sheets

(56)        References Cited

U.S. PATENT DOCUMENTS

| | | | |
|---|---|---|---|
| 12,080,452 B2 * | 9/2024 | Moriyama ............. | G01R 1/203 |
| 2012/0229247 A1 * | 9/2012 | Yoshioka ............... | G01R 1/203 |
| | | | 29/610.1 |
| 2013/0187749 A1 * | 7/2013 | Tsukada ................. | G01R 1/203 |
| | | | 29/610.1 |
| 2017/0125142 A1 * | 5/2017 | Nakamura ............. | H01C 13/00 |
| 2017/0162302 A1 | 6/2017 | Chiku | |
| 2019/0237226 A1 * | 8/2019 | Hetzler .................. | G01R 19/32 |

FOREIGN PATENT DOCUMENTS

| | | | |
|---|---|---|---|
| CN | 110277204 A | 9/2019 | |
| JP | 2007-329421 A | 12/2007 | |
| JP | 2015-204315 A | 11/2015 | |
| JP | 2018-170478 A | 11/2018 | |
| JP | 2019-527356 A | 9/2019 | |
| JP | 2020-145365 A | 9/2020 | |
| WO | 2011/028870 A1 | 3/2011 | |

OTHER PUBLICATIONS

International Search Report dated Aug. 31, 2021, issued in counterpart International Application No. PCT/JP2021/026411, with English translation. (4 pages).

Office Action dated Jun. 30, 2025, issued in counterpart CN application No. 202180070840.3 (8 pages).

\* cited by examiner

FIRST DIRECTION
(CURRENT DIRECTION)

SECOND DIRECTION

FIRST DIRECTION
(CURRENT DIRECTION)

SECOND DIRECTION

SHUNT RESISTOR AND SHUNT RESISTANCE DEVICE

TECHNICAL FIELD

The invention relates to a shunt resistor and a shunt resistance device.

BACKGROUND ART

There is a shunt resistor in which a current is passed through a resistance element and a magnitude of the current is detected from a voltage at both ends of the resistance element (see, for example, Patent document 1). Such a shunt resistor includes a disc-shaped resistance element, and two electrodes formed on both sides of the resistance element. One of the two electrodes is connected to a wiring (pad), and the other is connected to a bonding wire.

CITATION LIST

Patent Literature

Patent document 1: Japanese laid-open patent publication No. 2018-170478

SUMMARY OF INVENTION

Technical Problem

The electrodes connected to the bonding wire have a potential distribution. Therefore, a displacement of a connection position of the bonding wire may change the detected resistance value and the temperature coefficient of resistance (T.C.R) of the shunt resistor. The temperature coefficient of resistance is an index that indicates a rate of change in resistance value due to temperature.

Therefore, it is an object of the present invention to provide a shunt resistor and a shunt resistance device capable of suppressing variations in characteristics of the shunt resistor due to a connection position of wiring for voltage detection.

Solution to Problem

In an embodiment, there is provided a shunt resistor comprising an electrode member made of a conductive material. The electrode member comprising: a contact portion contacting a resistance element; and a slit formed on the contact portion.

In an embodiment, the slit extends in a direction perpendicular to a current direction.

In an embodiment, the contact portion has a first surface adjacent to the resistance element and a second surface opposite to the first surface, and the slit is a through hole connected to the first surface and the second surface.

In an embodiment, there is provided a shunt resistance device, comprising: a resistance element; an electrode member comprising a contact portion contacting the resistance element; and a voltage detection wiring connected to the electrode member. The electrode member comprises a slit formed on the contact portion, and the voltage detection wiring is arranged in a first wiring area between the slit and a slit-side end portion of the electrode member.

In an embodiment, the shunt resistor device comprises a current wiring connected to the electrode member, the current wiring being arranged in a second wiring area opposite to the first wiring area across the slit.

In an embodiment, the slit extends in a direction perpendicular to a current direction.

In an embodiment, the contact portion has a first surface adjacent to the resistance element and a second surface opposite to the first surface, and the slit is a through hole connected to the first surface and the second surface.

Advantageous Effects of Invention

According to the present invention, the slit is formed at the contact portion to suppress the variations in the characteristics of the shunt resistor due to the connection position of the wiring for voltage detection.

BRIEF DESCRIPTION OF DRAWINGS

FIG. 6 is a graph showing a variation of a resistance value of the shunt resistor due to the measurement position;

DESCRIPTION OF EMBODIMENTS

Figure 1:
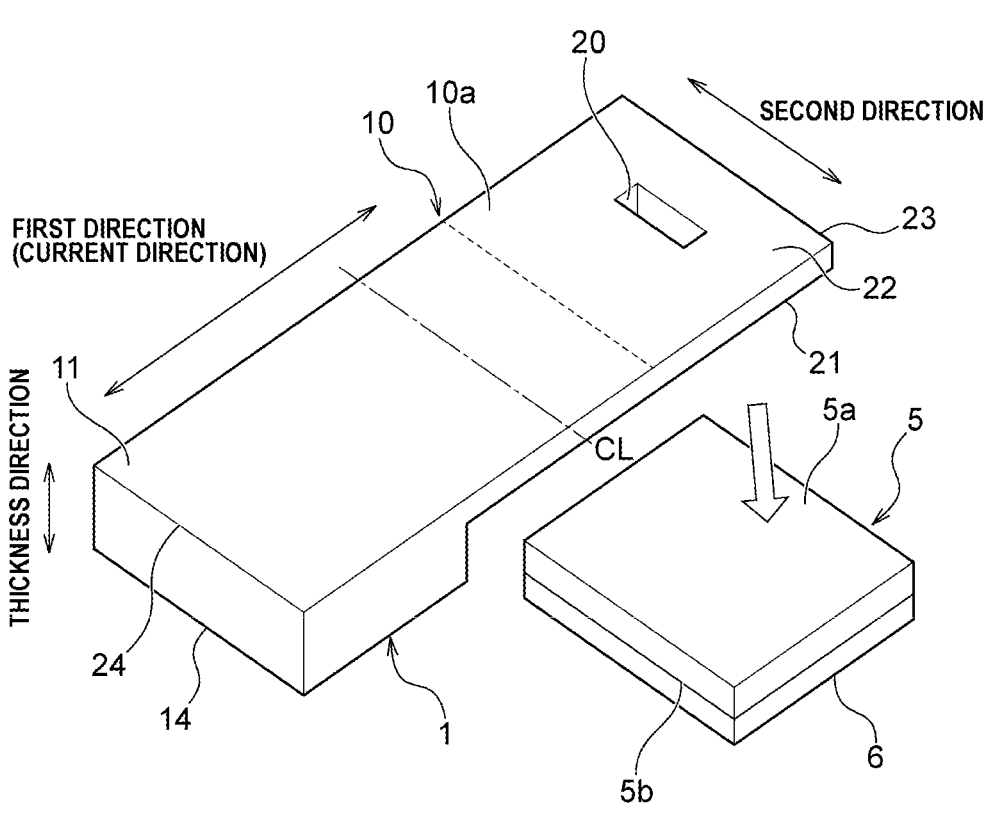
FIG. 1 is a perspective view showing one embodiment of a shunt resistor for current detection.

Embodiments of the invention will be described below with reference to the drawings. In the drawings described below, identical or equivalent components will be marked with the same symbol and redundant explanations will be omitted.

Figure 2:
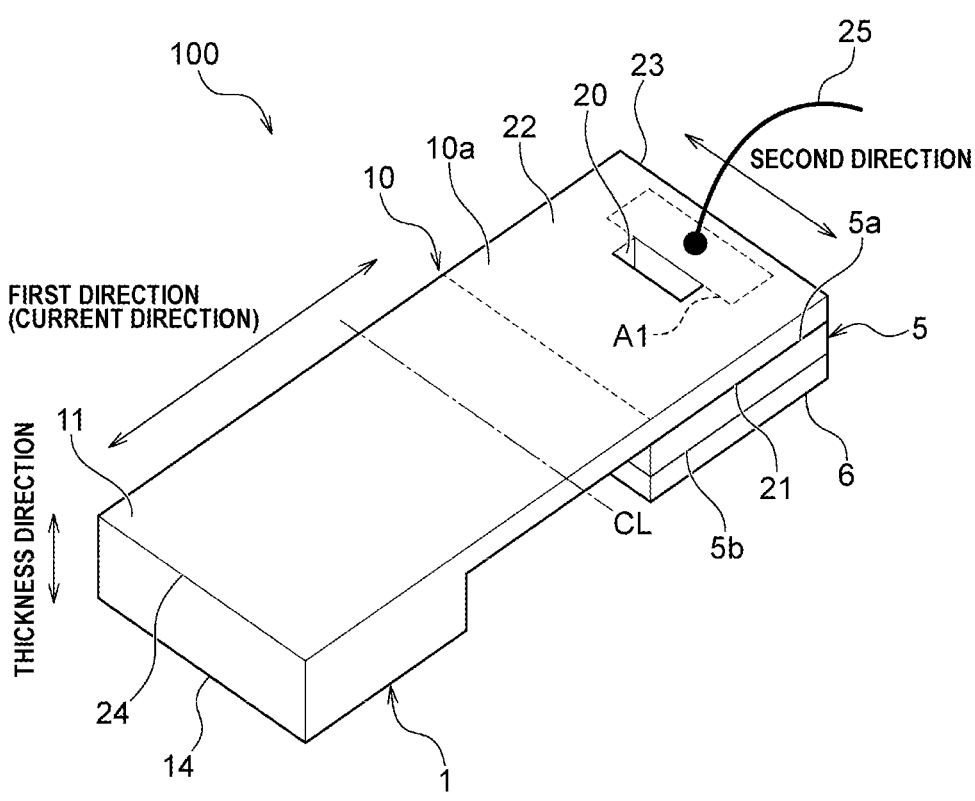
FIG. 2 is a perspective view showing one embodiment of the shunt resistor for current detection.

FIGS. 1 and 2 are perspective views showing an embodiment of a shunt resistor for current detection. As shown in FIGS. 1 and 2, the shunt resistor 1 includes a plate-like (thin plate-like) resistance element 5 having a predetermined thickness and width, a plate-like (thin plate-like) electrode 6 made of a conductive material, and an electrode member 10 made of a conductive material.

An example of a material of the resistance element 5 is a low-resistance alloy material such as a Cu—Mn—Ni alloy or a Ni—Cr alloy. An example of a material of the electrode 6 and the electrode member 10 is copper (Cu), which is a highly conductive metal.

The resistance element 5 has a first resistance element surface 5a and a second resistance element surface 5b, which is an opposite side of the first resistance element surface 5a. The electrode member 10 is connected to the first resistance element surface 5a, and the electrode 6 is connected to the second resistance element surface 5b. That is, the electrode 6, the resistance element 5, and the electrode member 10 are laminated in a thickness direction of the shunt resistor 1 in this order.

In FIGS. 1 and 2, a thickness direction of the shunt resistor 1 is parallel to a vertical direction. A first direction is a length direction of the shunt resistor 1. A second direction is a width direction of the shunt resistor 1, and is perpendicular to the first direction.

The electrode member 10 includes a rectangular-shaped body portion 11 and a terminal portion 14 extending from the body portion 11 in the thickness direction. The body portion 11 and the terminal portion 14 are integrally molded members.

The electrode member 10 (more specifically, the body portion 11) has a contact portion 10a that contacts the resistance element 5. By moving the electrode member 10 in a direction indicated by a white arrow in FIG. 1, the contact portion 10a of the electrode member 10 is connected to the resistance element 5 (see FIG. 2). The terminal portion 14 is arranged on an opposite side of the contact portion 10a with respect to a center line CL of the electrode member 10. The center line CL is a virtual line segment that extends parallel to the second direction of the shunt resistor 1 and bisects the electrode member 10.

The terminal portion 14 and the electrode 6 (and the resistance element 5) are spaced apart from each other in first direction of the shunt resistor 1. The first direction is parallel to a current direction of the current passing through the shunt resistor 1.

The electrode member 10 may be connected to the first resistance element surface 5a of the resistance element 5 by connection means such as welding such as pressure welding, solder, metal nanoparticles (silver paste using silver nanoparticles or copper paste using copper nanoparticles). The electrode 6 may also be connected to the second resistance element surface 5b of the resistance element 5 by the same connection means. The terminal portion 14 and the electrode 6 are subjected to a surface treatment such as Sn plating or Ni plating to enable solder mounting.

As shown in FIGS. 1 and 2, the electrode member 10 includes a slit 20 formed in the contact portion 10a. The slit 20 is a long hole extending in a direction perpendicular to a current direction (i.e., parallel to a second direction).

The slit 20 penetrates from a surface of the electrode member 10 to reach the resistance element 5. More specifically, the contact portion 10a has a first surface 21 adjacent to the resistance element 5 and a second surface 22 opposite to the first surface 21. The slit 20 is a through hole connected to these first surface 21 and second surface 22.

The electrode member 10 has two end portions 23, 24 in the first direction. The end portion 23 is a slit-side end portion adjacent to the slit 20, and the end portion 24 is an opposite end portion away from the slit 20. Thus, a distance between the slit 20 and the slit-side end portion 23 is smaller than a distance between the slit 20 and the opposite end portion 24.

As shown in FIG. 2, a voltage detection wiring 25 is connected to a wiring area A1 (frame surrounded by dotted lines) between the slit 20 and the slit-side end portion 23 during mounting. This voltage detection wiring 25 is a wiring (terminal) for detecting a potential difference in the resistance element 5 (potential difference generated between the first resistance element surface 5a and the second resistance element surface 5b). The resistance element 5, the electrode member 10, and the voltage detection wiring 25 connected to the electrode member 10 constitute a shunt resistance device 100.

In one embodiment, the voltage detection wiring 25 may be a bonding wire. In this case, the wiring area A1 of the electrode member 10 (more specifically, the contact portion 10a) is subjected to a surface treatment (e.g., NiP plating or Ni plating) to enable bonding.

Figure 3:
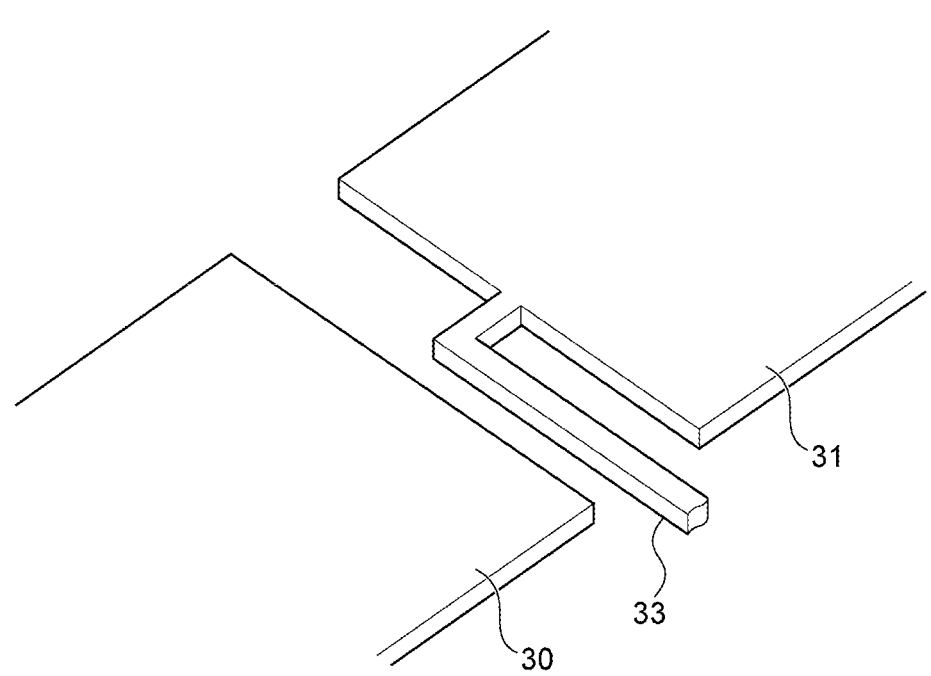
FIG. 3 is a view showing an embodiment of a mounting land pattern.
Figure 4:
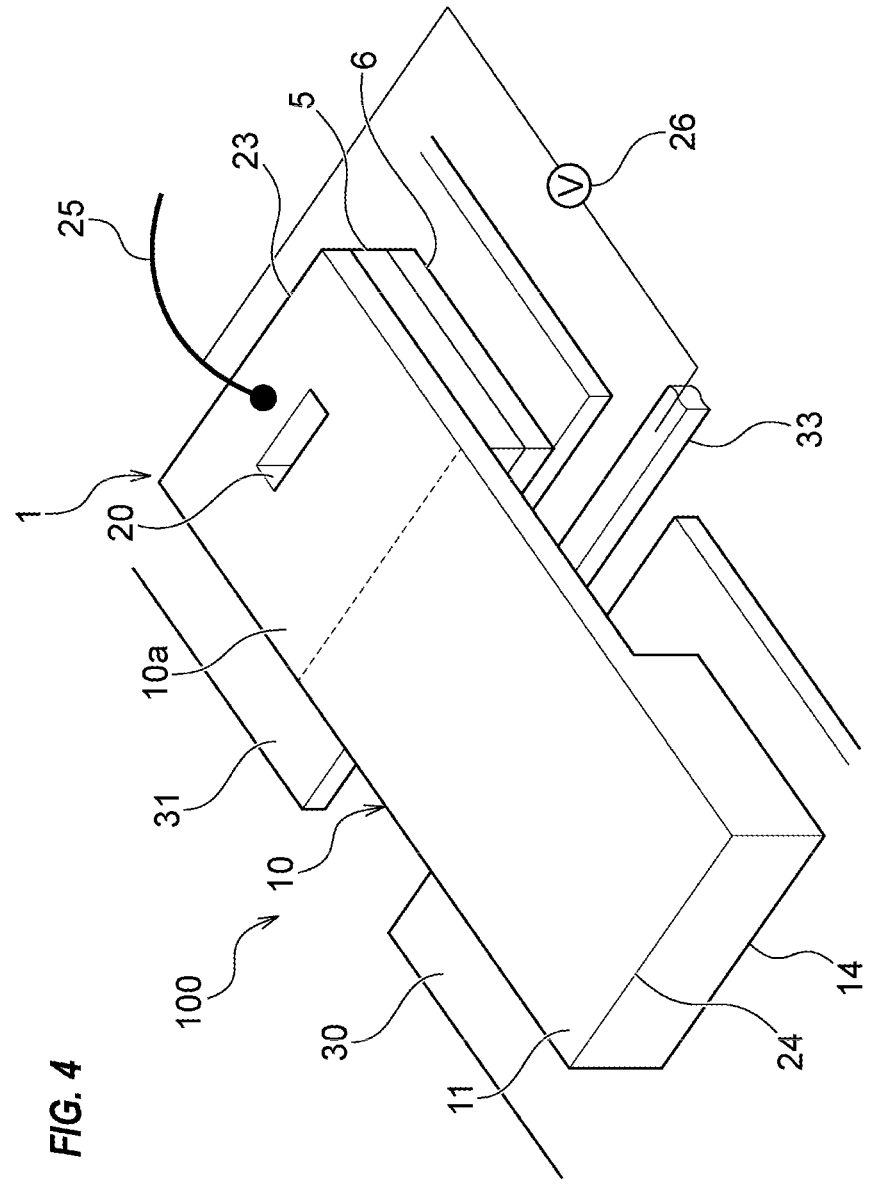
FIG. 4 is a view showing a shunt resistance device mounted on the mounting land pattern shown in FIG. 3.

FIG. 3 is a view showing an embodiment of a mounting land pattern. FIG. 4 is a view showing a shunt resistance device 100 mounted on the mounting land pattern shown in FIG. 3. As shown in FIGS. 3 and 4, a draw-out line 33 is arranged between current-carrying patterns 30, 31, and the draw-out line 33 is connected to the current-carrying pattern 31. The draw-out line 33 is a voltage detection terminal for detecting the voltage of the resistance element 5.

The current-carrying patterns 30, 31 are formed on a circuit board, such as a printed circuit board, not shown. Each of the terminal portion 14 and the electrode 6 are connected (bonded) to each of the current-carrying patterns 30, 31 by means of solder or other means. A current path is formed by the current-carrying pattern 30, the shunt resistor 1, and the current-carrying pattern 31. In this embodiment, the potential difference between the voltage detection wiring 25 and the draw-out line 33 (i.e., the potential difference at the resistance element 5) can be measured using a voltage measurement device 26. By measuring such a potential difference, a current value is calculated. The calculated current value is used, for example, to control various devices mounted in an automobile.

Figure 5:
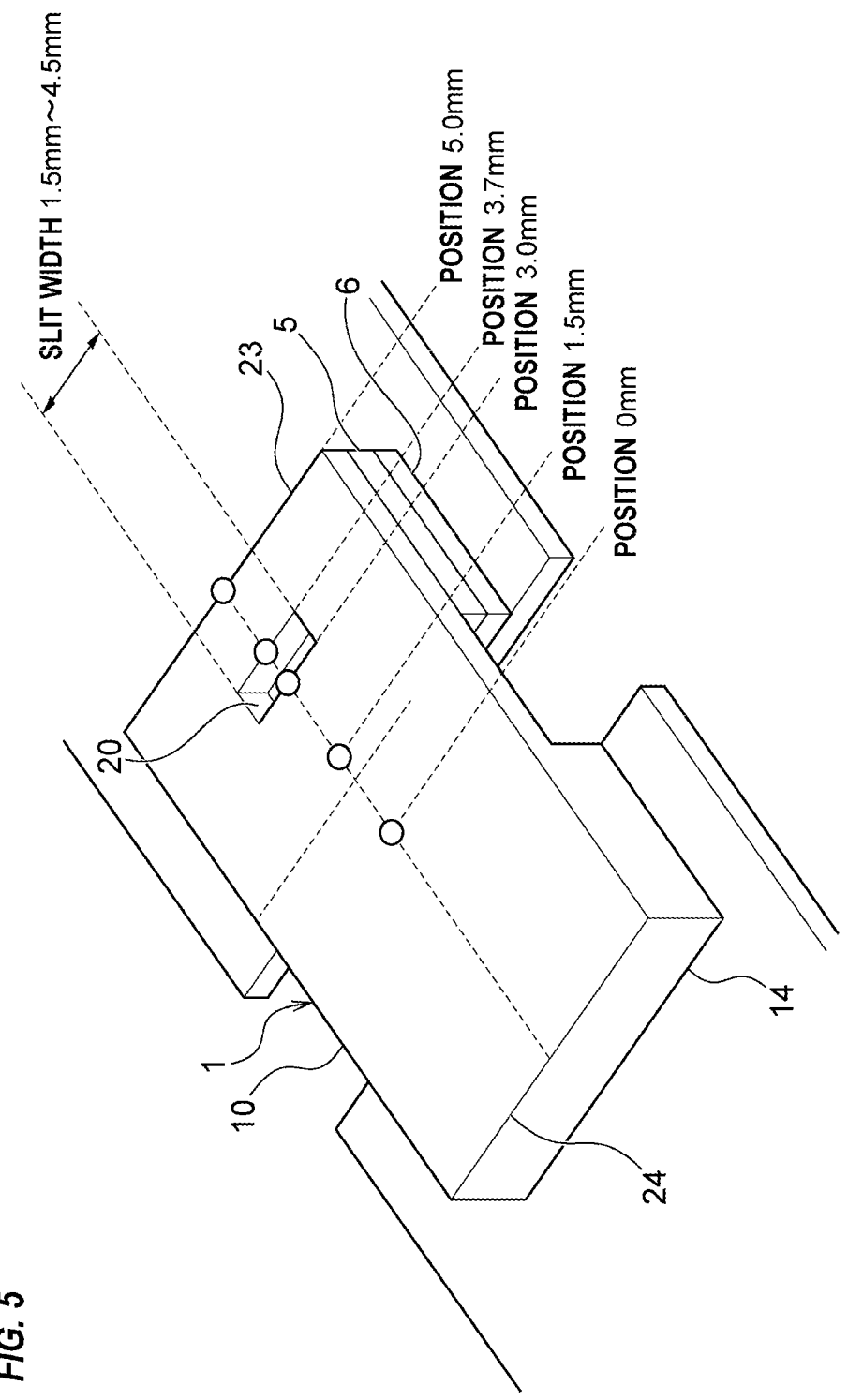
FIG. 5 is a view showing a resistance value and a measurement position of T.C.R in order to verify an effectiveness of the shunt resistor with the slit in the present embodiment.
Figure 6:
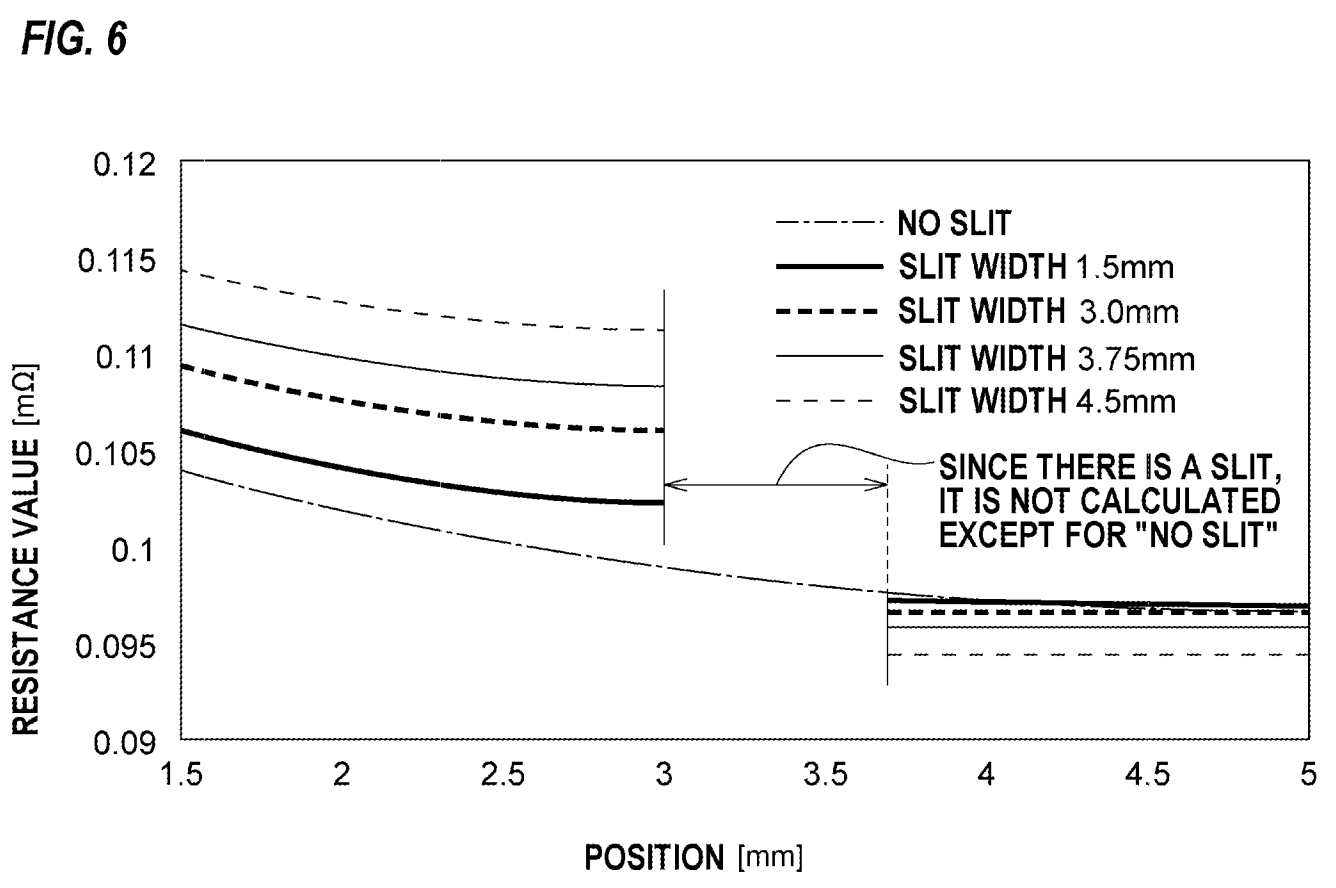
Figure 7:
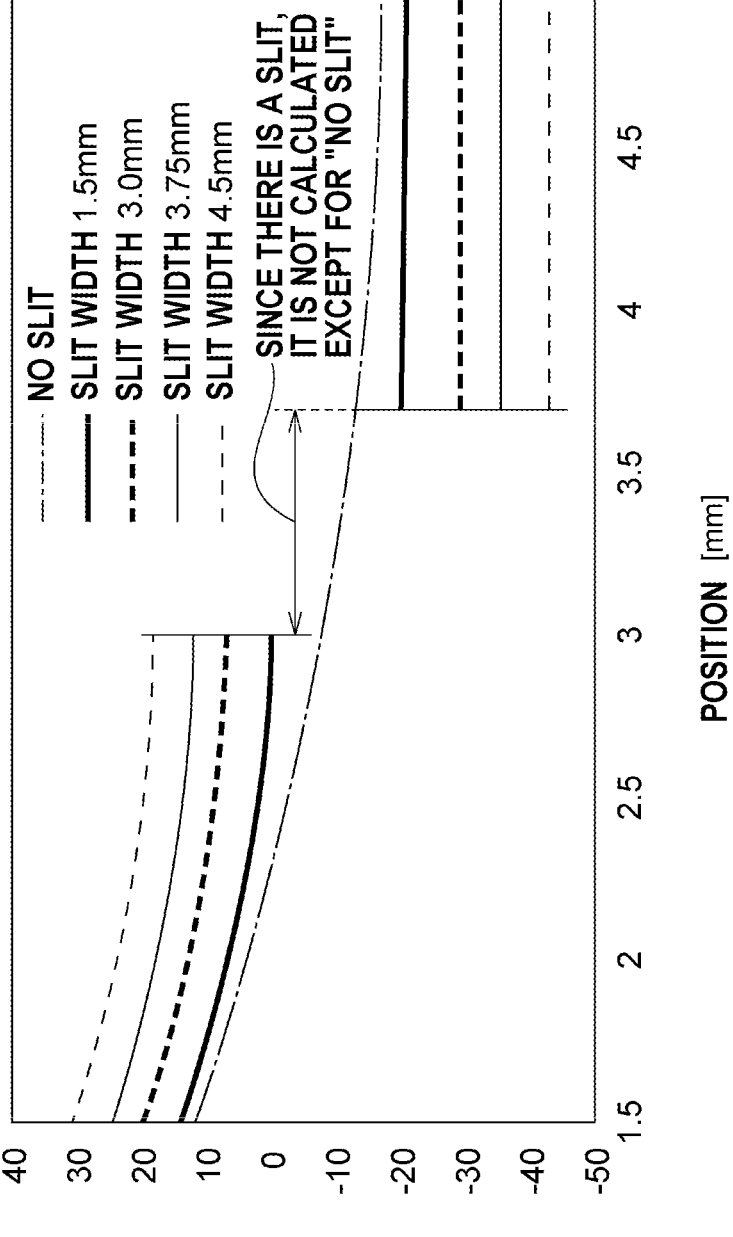
FIG. 7 is a graph showing a variation of T.C.R of the shunt resistor due to the measurement position.

FIG. 5 is a view showing a resistance value and a measurement position of T.C.R in order to verify an effectiveness of the shunt resistor 1 with the slit 20 in the present embodiment. FIG. 6 is a graph showing a variation of the resistance value of the shunt resistor 1 due to the measurement position. FIG. 7 is a graph showing a variation of T.C.R of the shunt resistor 1 due to the measurement position.

FIG. 6 shows simulation results of resistance values when sizes (1.5 mm to 4.5 mm) of widths of the slit 20 and the measurement positions (1.5 mm, 3.0 mm, 3.7 mm, and 5.0 mm) are varied. FIG. 7 shows simulation results of T.C.R when sizes (1.5 mm to 4.5 mm) of widths of the slit 20 and the measurement positions (1.5 mm, 3.0 mm, 3.7 mm, and 5.0 mm) are varied.

A set resistance value of the shunt resistor 1 is 100 μΩ in this embodiment. The resistance value and the measurement position of T.C.R correspond to a distance from a reference position to the slit-side end portion 23, when a position 0 mm is the reference position (a center position of the electrode member 10 on a center line CL (see FIG. 1)).

A horizontal axis of FIG. 6 shows the measurement position of the resistance value, and a vertical axis of FIG. 6 shows the resistance value [mΩ]. As is clear from FIG. 6, at a position on the reference position side of the electrode member 10, the larger the width of the slit 20, the larger the resistance value. The farther the measurement position is from the reference position of the electrode member 10, the smaller the resistance value becomes. Therefore, the resistance value can be changed by changing the size of the width of the slit 20. On the other hand, at the position of the slit-side end portion 23 than the position of the slit 20, as the size of the width of the slit 20 increases, the resistance value becomes smaller but does not change so much.

Therefore, when the voltage detection wiring 25 is connected (bonded) to the position on the reference position side than the position of the slit 20, a resistance value characteristic changes according to a connection position of the voltage detection wiring 25. On the other hand, when the voltage detection wiring 25 is connected (bonded) at the position of the slit-side end portion 23 than the position of the slit 20, the resistance value characteristic hardly changes according to the connection position of the voltage detection wiring 25. Therefore, it is desirable to connect the voltage detection wiring 25 at the position of the slit-side end portion 23 rather than the position of the slit 20 in order to suppress the variation of the characteristics of the shunt resistor 1.

Although not shown in the simulation results in FIG. 6, the resistance value can be changed depending on the position where the slit 20 is formed. In other words, if the slit 20 is formed at the position on the reference position side, the resistance value increases, and if the slit 20 is formed at the position on the slit-side end portion 23, the resistance value decreases.

A horizontal axis of FIG. 7 shows the measurement position of T.C.R. A vertical axis of FIG. 7 shows T.C.R [ppm/deg]. As is clear from FIG. 7, at the position on the reference position side of the electrode member 10, the larger the width of the slit 20 is, the more positive the T.C.R becomes. The farther the measurement position is from the reference position of the electrode member 10, the more the T.C.R becomes negative. Therefore, by changing the size of the width of the slit 20, the T.C.R can be changed. On the other hand, at the position of the slit-side end portion 23 than the position of the slit 20, the T.C.R becomes negative when the size of the width of the slit 20 is increased. The T.C.R hardly changes when the measurement position is changed.

Therefore, when the voltage detection wiring 25 is connected (bonded) at the position on the reference position side than the position of the slit 20, the T.C.R characteristic changes according to the connection position of the voltage detection wiring 25. On the other hand, when the voltage detection wiring 25 is connected (bonded) at the position of the slit-side end portion 23 than the position of the slit 20, the T.C.R characteristics hardly change according to the connection position of the voltage detection wiring 25. Therefore, it is desirable to connect the voltage detection wiring 25 at the position of the slit-side end portion 23 than the position of the slit 20 in order to suppress the variation of the characteristics of the shunt resistor 1.

As is clear from FIG. 7, the T.C.R characteristic can be changed by changing the size of the width of the slit 20. In particular, as shown in FIG. 7, the T.C.R characteristic resulting from changing the size of the width of the slit 20 changes more significantly at the slit-side end portion 23 than at the reference position side.

Although not shown in the simulation results in FIG. 7, T.C.R can be changed according to the position where the slit 20 is formed. In other words, when the slit 20 is formed at the position on the reference position side, T.C.R is adjusted to the positive side, and when the slit 20 is formed at the position on the slit-side end portion 23, T.C.R is adjusted to the negative side.

An additional effect of forming the slit 20 is as follows. In a shunt resistor of the Patent document 1 (i.e., Japanese laid-open patent publication No. 2018-170478), one method of changing the resistance value is to cut the resistance element. For example, by cutting a side of the resistance element, the cross-sectional area (i.e., current path) of the resistance element is reduced, and the resistance value is increased. However, such a method may cause residual stress in the resistance element. Such residual stress may cause the resistance value to fluctuate after mounting on a circuit board. According to the embodiment, the resistance value can be changed by forming the slit 20 without cutting the resistance element 5. Therefore, fluctuations in the resistance value caused by residual stress do not occur.

Figure 8:
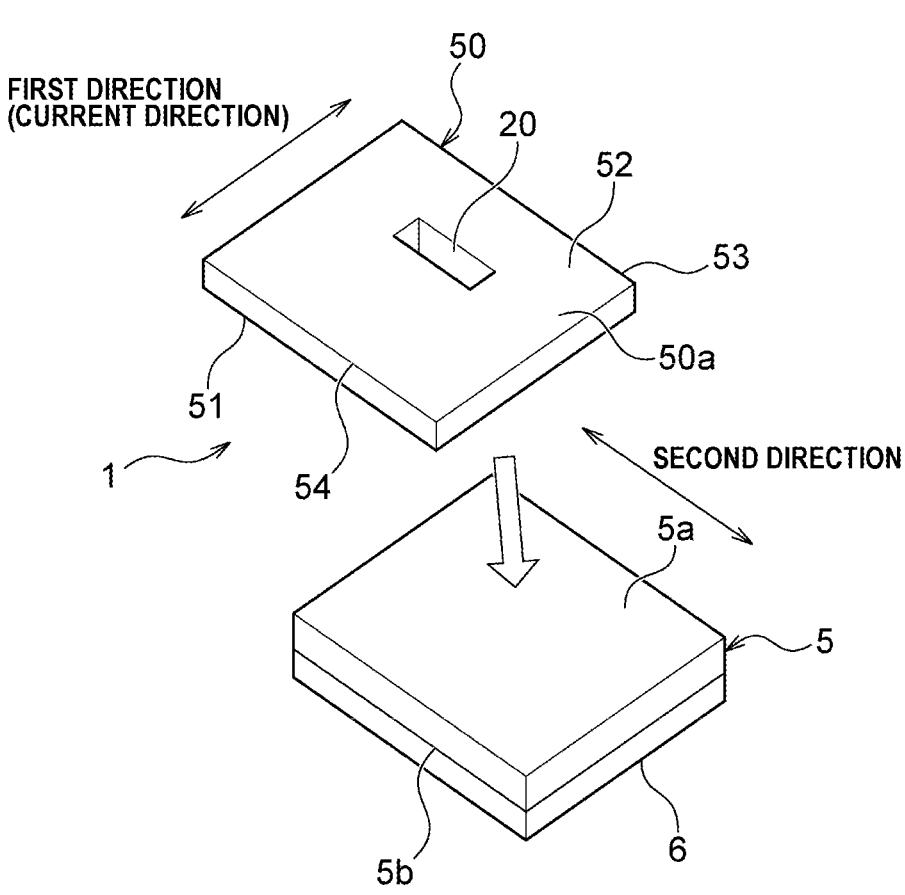
FIG. 8 is a view showing another embodiment of the shunt resistor.
Figure 9:
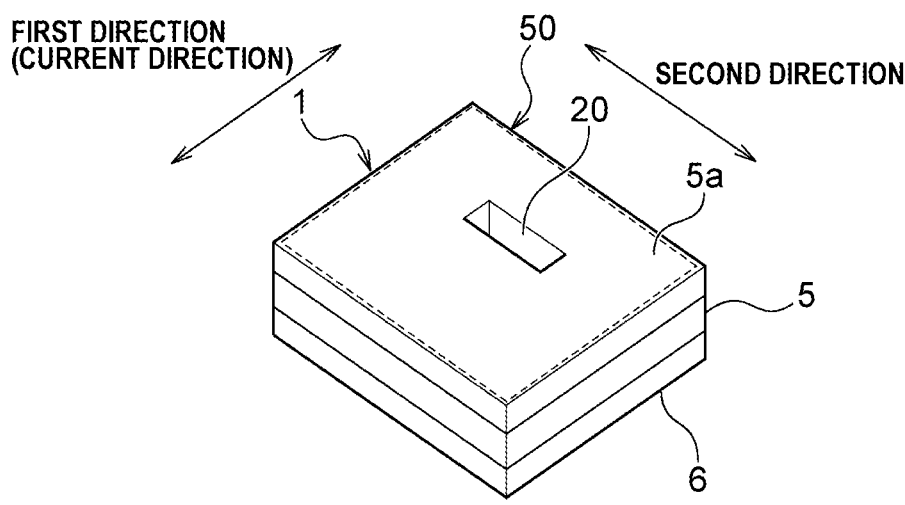
FIG. 9 is a view showing another embodiment of the shunt resistor.

FIGS. 8 and 9 are views showing other embodiments of the shunt resistor 1. The configurations of this embodiment, which is not specifically described, is the same as that of the embodiment described above, so its redundant description is omitted. As shown in FIGS. 8 and 9, an electrode member 50 has a smaller size than the electrode member 10 of the embodiment described above. More specifically, the electrode member 50 has a shorter length in the first direction than the electrode member 10.

The electrode member 50 includes a contact portion 50*a* that contacts the resistance element 5 in its entirety. By moving the electrode member 50 in a direction indicated by a white arrow in FIG. 8, the contact portion 50*a* of the electrode member 50 is connected to the resistance element 5 (see FIG. 9). As shown in FIG. 9, the electrode member 50 has the same size as the resistance element 5 and the electrode 6.

A surface of the electrode member 50 (a surface surrounded by dotted lines in FIG. 9 (in other words, an entire surface of the contact portion 50*a*)) is subjected to a surface treatment (e.g., NiP plating or Ni plating) to enable bonding. The electrode 6 is subjected to a surface treatment such as Sn plating or Ni plating to enable solder mounting.

As in the embodiment described above, the slit 20 is a long hole extending in a direction perpendicular to the current direction. The contact portion 50*a* of the electrode member 50 has a first surface 51 adjacent to the resistance element 5 and a second surface 52 opposite to the first surface 51, and the slit 20 is a through hole connected to these first surface 51 and second surface 52.

Figure 10:
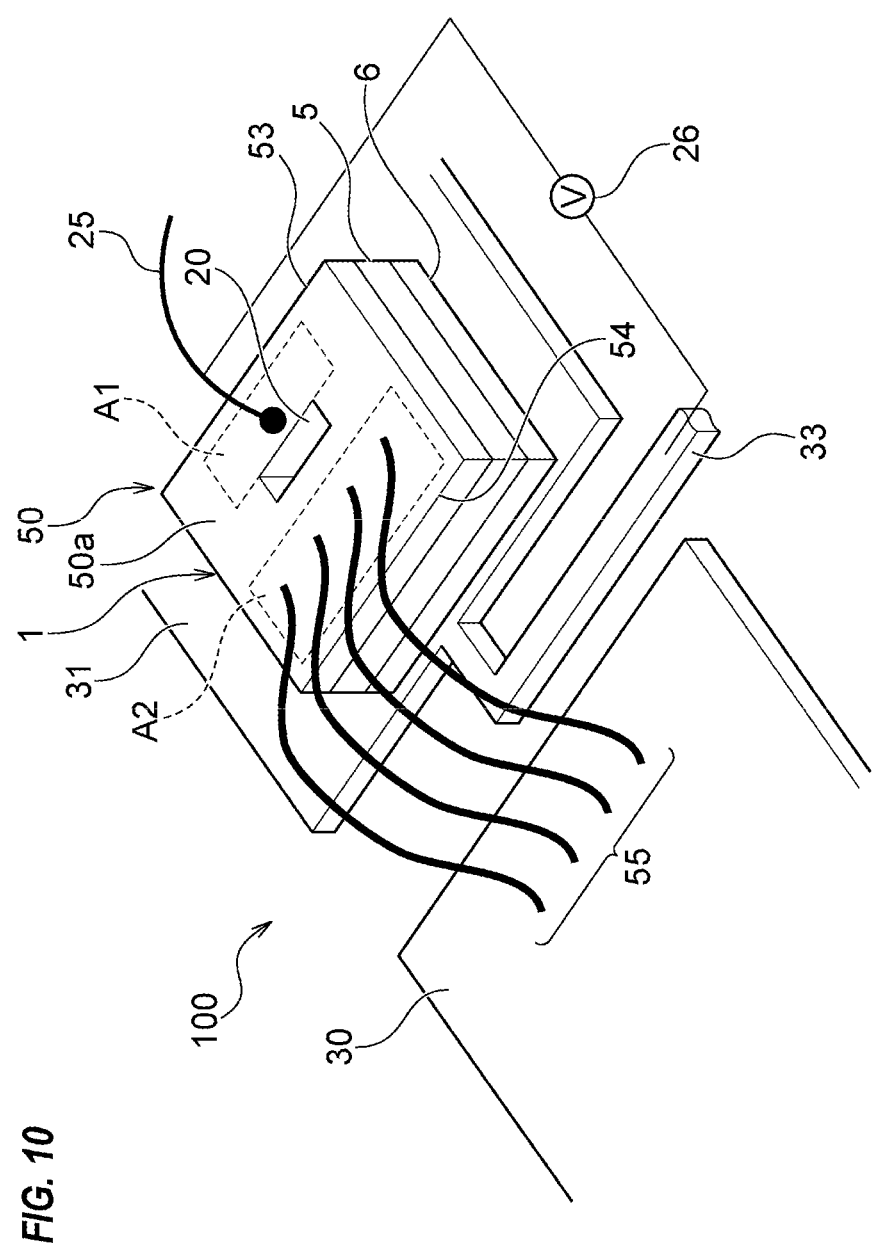
FIG. 10 is a view showing an embodiment of the shunt resistance device composed of the shunt resistor shown in FIG. 9 mounted on the mounting land pattern shown in FIG. 3.

FIG. 10 is a view showing an embodiment of a shunt resistance device 100 composed of the shunt resistor shown in FIG. 9 mounted on the mounting land pattern shown in FIG. 3. In the embodiment shown in FIG. 10, the shunt resistance device 100 includes a voltage detection wiring 25 and a current wiring 55 connected to the electrode member 50.

As shown in FIG. 10, the voltage detection wiring 25 is arranged in the wiring area A1 (frame surrounded by dotted lines) between the slit 20 and the slit-side end portion 53. The current wiring 55 is arranged in the wiring area A2 (frame surrounded by dotted lines) on the opposite side of the wiring area A1 across the slit 20. This wiring area A2 is an area between the slit 20 and an opposite end portion 54.

In the embodiment shown in FIG. 10, the current wiring 55 is a plurality (in FIG. 10, four) of bonding wires, but the number of current wirings 55 is not limited to this embodiment. The current wirings 55 are connected to the current-carrying pattern 30 and the electrode member 50. The current path is formed by the current-carrying pattern 30, the current wiring 55, the shunt resistor 1, and the current-carrying pattern 31.

Figure 11:
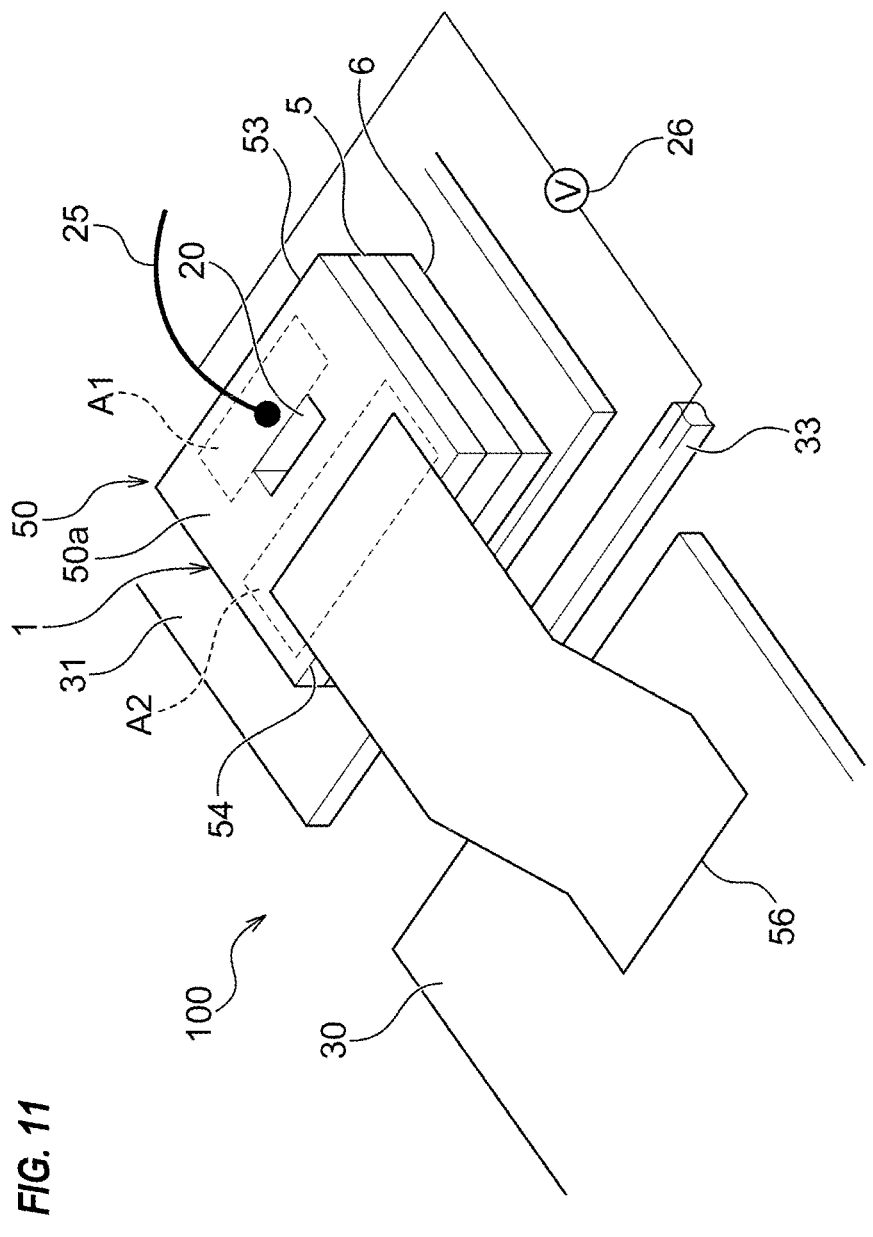
FIG. 11 is a view showing another embodiment of the shunt resistance device composed of the shunt resistor shown in FIG. 9 mounted on the mounting land pattern shown in FIG. 3.

FIG. 11 is a view showing another embodiment of the shunt resistance device 100 composed of the shunt resistor shown in FIG. 9 mounted on the mounting land pattern shown in FIG. 3. In the embodiment shown in FIG. 11, the shunt resistance device 100 includes a current wiring 56 consisting of a clip-shaped terminal instead of the current wiring 55 consisting of a plurality of bonding wires. As shown in FIGS. 10 and 11, the shunt resistance device 100 may include at least one of a plurality of bonding wires and clip-shaped terminals as current wiring.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a shunt resistor and a shunt resistance device.

REFERENCE SIGNS LIST 1 shunt resistor
5 resistance element
5a first resistance element surface
5b second resistance element surface
6 electrode
10 electrode member
10a contact portion
11 body portion
14 terminal portion
20 slit
21 first surface
22 second surface
23 slit-side end portion
24 opposite end portion
25 voltage detection wiring
26 voltage measurement device
30 current-carrying pattern
31 current-carrying pattern
33 draw-out line
50 electrode member
50a contact portion
51 first surface
52 second surface
53 slit-side end portion
54 opposite end portion
55 current wiring
56 current wiring

The invention claimed is:

1. A shunt resistor comprising an electrode member made of a conductive material, an electrode, and a resistance element, wherein the resistance element has a plate shape with thickness, and has a first resistance element surface and a second resistance element surface opposite to the first resistance element surface in a thickness direction, wherein the electrode member has a contact portion configured to contact the resistance element, wherein the contact portion has a first surface adjacent to the resistance element and a second surface opposite to the first surface, wherein the contact portion, the resistance element, and the electrode are laminated in the thickness direction, so that the first surface is connected to the first resistance element surface, and the electrode is connected to the second resistance element surface, and wherein the electrode member comprising:
   a slit formed on the contact portion.

2. The shunt resistor according to claim 1, wherein the slit is long in a direction perpendicular to a current direction.

3. The shunt resistor according to claim 1,
   wherein the slit is a through hole penetrated from the first surface to the second surface.

4. A shunt resistance device, comprising:
   a resistance element, an electrode member, and an electrode;

the electrode member comprising a contact portion contacting the resistance element; and a voltage detection wiring connected to the electrode member, wherein the resistance element has a plate shape with thickness, and has a first resistance element surface and a second resistance element surface opposite to the first resistance element surface in a thickness direction, wherein the contact portion has a first surface adjacent to the resistance element and a second surface opposite to the first surface, wherein the contact portion, the resistance element, and the electrode are laminated in the thickness direction, so that the first surface is connected to the first resistance element surface, and the electrode is connected to the second resistance element surface, wherein the electrode member comprises a slit formed on the contact portion, and wherein the voltage detection wiring is arranged in a first wiring area between the slit and a slit-side end portion of the electrode member.

5. The shunt resistance device according to claim 4, comprising a current wiring connected to the electrode member, the current wiring being arranged in a second wiring area opposite to the first wiring area across the slit.

6. The shunt resistance device according to claim 4, wherein the slit is long in a direction perpendicular to a current direction.

7. The shunt resistance device according to claim 4,
   wherein the slit is a through hole penetrated from the first surface to the second surface.

* * * * *